United States Patent [19]

Brune et al.

[11] Patent Number: 4,861,274

[45] Date of Patent: Aug. 29, 1989

[54] BACKPLANE HAVING A MOVABLE CONTACT MEANS

[75] Inventors: Johannes Brune, Erlangen; Hans-Peter Latussek, Feucht, both of Fed. Rep. of Germany

[73] Assignee: Siemens Aktiengesellschaft, Munich, Fed. Rep. of Germany

[21] Appl. No.: 170,147

[22] Filed: Mar. 18, 1988

[30] Foreign Application Priority Data

Mar. 20, 1987 [DE] Fed. Rep. of Germany ....... 3709118

[51] Int. Cl.$^4$ .......................... H01R 9/22; H01R 13/70
[52] U.S. Cl. ..................................... 439/189; 361/407
[58] Field of Search ............................ 439/55, 59–62, 439/92, 101, 108, 109, 188, 189; 361/407, 413, 415, 392, 393; 200/51.1, 61.19

[56] References Cited

U.S. PATENT DOCUMENTS 3,470,421  9/1969  Shore et al. ......................... 361/407
4,179,173  12/1979  Rise, III ............................. 200/51.1

Primary Examiner—Neil Abrams
Attorney, Agent, or Firm—Kenyon & Kenyon

[57] ABSTRACT

A backplane has several socket connectors arranged in parallel, side by side on a side that faces the module and at least one bus that comprises several bus lines. An outer row of contact pins that function as bus contact pins are always shorter than the contact pins of a middle rows of contacts. The bus contact pins of each socket connector of the backplane line up with auxiliary contact pins. The auxiliary contact pins belong to one bus and are electrically connected with a bus line. The bus contact pins of each socket connector ar electrically connected to the corresponding auxiliary contact pins via contact means which can be moved with a handling means. Thus, the modules can be separated from a bus that extends beyond the modules without having to pull out the modules from their plug-in locations on a module carrier.

8 Claims, 1 Drawing Sheet

BACKPLANE HAVING A MOVABLE CONTACT MEANS

RELATED APPLICATION

Of interest to the present application are copending applications titled "Backplane With Associated Handling Means", Ser. No. 170,146, "Backplane Having A Jumper Plug to Connect Socket Connectors to a Bus Line", Ser. No. 170,766, and "Backplane", Ser. No. 170,145, all of which have the same assignee and filing date as the present application.

BACKGROUND OF THE INVENTION

1. Field of the Invention.

The present invention relates to a backplane that has several socket connectors arranged in parallel, side by side on a side of the backplane that faces the module. The pins on the side facing away from the module form a pin field. At least one bus consists a plurality of bus lines.

2. Description of Related Art.

Backplanes are commercially available and are known, for instance, as VME bus boards. The VME bus is a standardized bus which is responsible for fast data traffic between the most important components of a bus system. The bus structure forms the connecting bars between the building blocks and modules of a micro or minicomputer system. The bus structures also varies according to the system components used and the desired performance. The structure influences the performance of the overall system because the entire data exchange takes place via such bus systems. The data exchange takes place, for instance, in a 8-, 16- or 32-bit format. For example, 8, 16 or 32 bus line systems interconnect the individual modules of a bus system. A fault caused by a short circuit of an output driver with the supply voltage of a bus participant can block the entire bus system. A diagnostic routine can localize the defective bus participant for many types of faults. However, some types of faults can be determined only by sequentially separating all bus participants from the bus until the defective participant is found and the trouble corrected. The entire function of the participant concerned is put out of operation when the individual bus participants are pulled out of their plug-in locations in a module carrier. This fault isolation process leads to down time.

SUMMARY OF THE INVENTION

It is an object of the invention to develop an improved backplane that enables at least one module to be separated from a bus having several modules without having to pull out the module from its place in a module carrier.

According to the present invention, the contact pins provided as bus contact pins on the outer rows of contact pins of the socket connectors are shorter than the contact pins of the middle contact pin rows. The backplane is provided with additional contact pins that are lined up with the bus contact pins of each socket connector. The additional contact pins of a bus are electrically connected to each other with a bus line. The bus contact pins of each socket connector can be electrically connected to the corresponding additional contact pins via contact means that can be moved using handling means.

The respective contact pins of the socket connectors that serve as bus contact pins can be electrically connected to an additional contact pin with a movable contact means. Any module connected to a bus going beyond the modules can likewise be electrically separated from this bus without the need to pull the module from its plug-in location on a module carrier. The contact means can be moved, for instance, from an electrically conducting position to an electrically separated position with handling means arranged on the side of the backplane facing away from the modules. It is particularly advantageous that the contact means and the handling means are arranged in the shadow of each socket connector, a positioning that requires no additional space. In addition, the handling means can be connected to movable contact means and arranged on mutually opposite sides of the backplane. The handling means can be connected as a retrofit to the contact means. The assembly is thus substantially simplified because the backplane can be moved over a wave-soldering bath.

One advantageous embodiment of the movable contact means provides a cylindrical contact as the movable contact. The movable contact is positioned in the interior in the front area with a ring-shaped contact projection. The ring-shaped contact projections permits removing oxide layers generated on the bus contact pins and the additional contact pins.

A further embodiment of the backplane of the present invention provides resilient contact pins as the movable contact means. The contact pins are connected to bus contact pins and are held against the additional contact pins by spring force. This design of the movable contact means removes oxide layers generated on the additional contact pins through force generated by the resilient contact pins.

The connection between the bus contact pins and the additional contact pins is controlled in conjunction with the resilient contact pins and the handling means. The separator for the handling means is positioned on the side of the backplane that faces the modules. The motion of the separator causes an axial shift of the handle relative to the contact pins of the socket connectors that becomes a lifting motion at the resilient contact pins.

A further embodiment of the backplane provides each socket connector with a spacer that extends over the entire length of the socket connector. The socket connectors are thus adjusted and their contact pins are encapsulated. The socket connectors are additionally laterally braced by the spacer.

DETAILED DESCRIPTION

Figure 1:
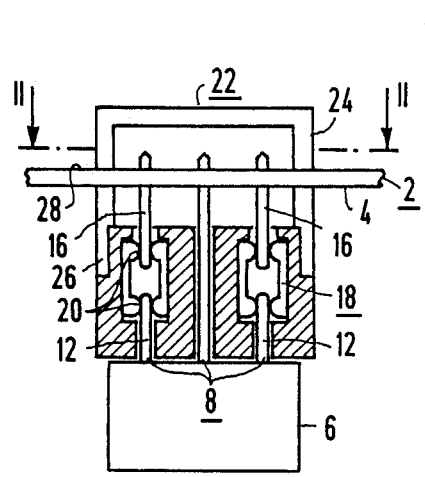
FIG. 1 shows one embodiment of the present invention.

FIG. 1 shows a backplane 2 having several socket connectors 6 arranged in parallel, side by side on a side 4 of the backplane, that faces the modules. The socket connectors 6 face the modules. Only one socket connector 6 is shown for reasons of clarity. The contact pins 8 of socket connector 6 serve as bus contact pins 10 and 12, respectively. These contact pins 10 and 12 form an outer-row of contact pins. The bus contact pins 10 and 12 of the outer row are shorter than the contact pins of the middle row. The bus contact pins 10 are not seen since they are covered up by the bus contact pins 12. Each bus contact pin 10 or 12 has an additional contact pin 14 or 16. These contact pins 14 and 16 are arranged in line with the bus contact pins 10 and 12 on the backplane on the side 4 that faces the modules. An electrically conducting connection is provided between the bus contact pins 10 and 12 and additional contact pins 14 and 16. A movable contact means 18 is also electrically connected to pins 10, 12 and 14, 16. A cylindrical contact is provided as the contact means 18. The ring-shaped contact projection 20 is provided in the interior of contact means 18 in the respective end face area. Two contact means 18 enclose a contact pin 8 on the middle row of the contact pins of each socket connector 6 to form a module. It is particularly advantageous that the contact means 18 of a bus form a structural unit. The contact pins 8 each serve as the middle row of contact pins for each socket connector 6 and a guide for the contact means 18.

The contact means 18 are further provided with handling means 22, a handle 24 and a separator 26. The handle and separator are arranged on opposite sides 4 and 28 of the backplane 2 and are designed to be separable. Handle 24 of handling means 22 can be detached from the separator 26. The handle 24 can then be removed during production so that the backplane 2 can be taken across a wave solder bath.

This embodiment has the additional advantage of requiring only one handle 24 to separate a defective module from the bus that goes beyond the modules. Separator 26 engages the contact means. The motion of the handling means 22 controls the contact between the respective bus contact pins 10 and 14 and the additional contact pins 14 and 16, respectively. An oxide layer generated at the contact pins 10, 14 and 12, 16 can be removed by the existing contact projections 20 of the contact means 18.

Figure 2:
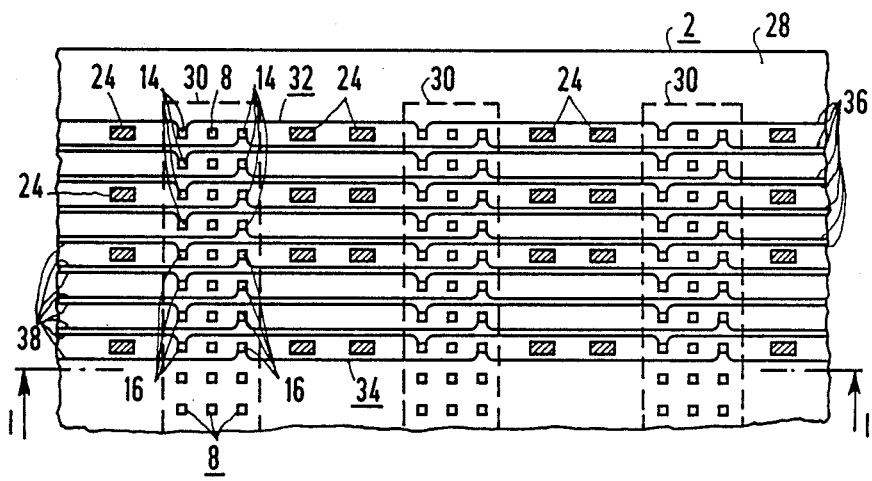
FIG. 2 shows a top view of the side of a backplane of the present invention that faces away from the modules.

FIG. 2 shows a top view on the side 28 of the backplane 2 that faces away from the modules along section II—II of FIG. 1. Socket connectors 6 are arranged on the side 4 of the backplane 2 and face the modules. The socket connectors are shown on the side 28 of the backplane 2 as facing away from the modules by dashed line 30. As socket connectors 6 comprise, for example, 96-pole socket connectors, the contact pins 8 are always arranged in three rows. In addition, two buses 32 and 34 each comprise eight bus lines 36 and 38. Bus 34 is redundant with bus 32 Bus systems 32 and 34 extend beyond the modules and comprise eight bus lines 36 and 38 that are parallel and side by side. Each socket connector 6 has eight bus contact pins 10 and 12. Four bus contact pins 10 and 11 are arranged in the outer contact pin rows of each socket connector 6. Only the additional contact pins 14 and 16 can be seen in FIG. 2 on side 28 of the backplane 2 facing away from the modules. These contact pins are aligned With bus contact pins 10 and 12. The additional contact pins 14 of the socket connector 6 are interconnected by a bus line 36 of bus 32 so as to extend beyond the module. The additional contact pins 16 of the socket connectors 6 are electrically interconnected by a bus line 38 of the bus 34 which extends beyond the modules. The depth of handling means 22 must correspond to the width of the bus 32 and 34 because buses 32 and 34 have a format of eight bus lines 36 and 38.

In operation, all bus participant modules of the backplane 2 are connected to the two buses 32 and 34. The data transfer between the individual bus participant modules takes place on bus 32. If a fault interrupts bus 32, it is possible to switch to redundant bus 34. The system thus remains in operation without regard to the occurrence of the fault.

The fault localization occurring on faulty bus 32 comprises the steps of sequentially separating the modules with the handling means 22 and the contact means 18 from the bus 32. A suitable testing routine then determines which module is blocking bus 32. Once localized, the defective bus participant module can be replaced. The indirect coupling of the bus participant modules to the buses 32 and 34 that extends beyond the modules permits separating individual modules at any time from the buses 32 and 34 without having to pull the module out of its plug-in location on a module carrier. Other functions of this module remain in operation when it is separated from the bus. The availability of the system is thus increased.

Figure 3:
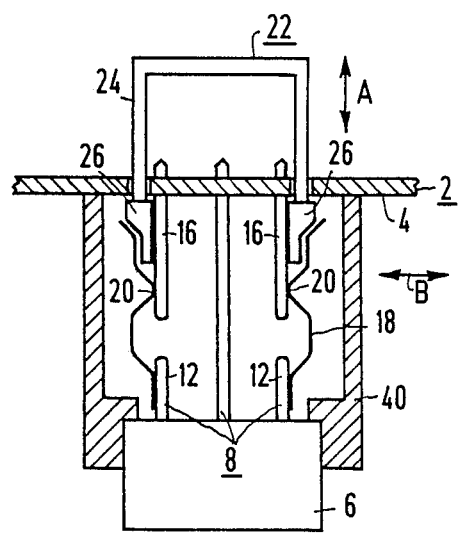
FIG. 3 shows another embodiment of the present invention.

FIG. 3 shows an alternate embodiment of the backplane 2 wherein only part of a socket connector 6 is shown. In this embodiment, resilient contact pins are provided as the contact means 18. The resilient contact pins are electrically connected to the bus contact pins 10 or 12 and pushed against the corresponding additional contact pins 14 and 16 by their spring force. In additional, a spacer 40 is arranged between the side 4 of the backplane 2 that faces the modules and the socket connector 6. Socket connector 6 is thus retained at a predetermined lateral distance and additionally supports the middle row of contact pins. Separator 26 of handling means 22 against which the resilient contact pins is braced is designed so that a separating motion, indicated by the double arrow A, changes into a lifting motion of the resilient contact pin, shown by a double arrow B. In motion, the resilient contact pins are guided by their contact projections 20 along the additional contact pins 14 and 16. Any oxide layers that have been generated are thus removed. In addition, the separator 26 and the handle 24 of each handling means 22 are designed so as to be separable. The production of the backplane 2 is thereby substantially simplified since the handle 24 can, if required, be connected to the separator 26 by retrofitting.

What is claimed is:

1. A backplane for subtrack having modules, comprising:
    a plurality of socket connectors arranged in parallel next to each other on a side of the backplane that faces the modules;
    each socket connector having a plurality of contact pins, the contact pins being arranged in three rows, the two outer rows of pins to function as bus contact pins and being shorter than the pins the middle one of the rows;
    at least one bus comprising a plurality of bus lines mounted on the backplane, the backplane being provided with auxiliary contact pins mounted thereon aligned with said bus contact pins in each socket connectors;
    said auxiliary pins being electrically interconnected to said bus lines on the backplane; and
    said bus contact pins of each socket connector being electrically connectable to the corresponding auxiliary contact pins through a movable contact means moved by a handling means such movement causing connecting or disconnection of the bus contact pins to the auxiliary contact pins.

2. A backplane as claimed in claim 1, wherein said movable contact means comprises a cylindrical contact that has a ring-shaped contact projection at an interior end face and electrically connecting one said bus contact pin to one said auxiliary contact pin.

3. A backplane as claimed in claim 1, wherein said movable contact means comprises resilient contact pins, each pin being connected to a corresponding bus contact pin and resting against said corresponding additional contact pin with its spring force.

4. A backplane as claimed in claim 2, wherein said handling means is connected to said movable contact means.

5. A backplane as claimed in claim 1, wherein said handling means comprises a separator and a handle.

6. A backplane as claimed in claim 5, wherein said separator and said handle are mechanically separable.

7. A backplane as claimed in claim 5, wherein said separator has a separating motion that causes a lifting motion of said resilient contact pins.

8. A backplane as claimed in claim 1, wherein said socket connectors each comprise a spacer that si arranged between the side of the backplane facing the modules and said socket connectors.

* * * * *